United States Patent [19]

Anstey et al.

[11] 4,381,458
[45] Apr. 26, 1983

[54] BACK-UP ELECTRICAL POWER SUPPLIES

[75] Inventors: Michael J. Anstey, Wokingham; David F. Brown, Thorplands, both of England

[73] Assignee: Racal Microelectronic Systems Limited, Bracknell, England

[21] Appl. No.: 290,104

[22] Filed: Aug. 4, 1981

[30] Foreign Application Priority Data

Aug. 6, 1980 [GB] United Kingdom ............... 8025573
Sep. 24, 1980 [GB] United Kingdom ............... 8030819
Feb. 9, 1981 [GB] United Kingdom ............... 8103834
Jun. 29, 1981 [GB] United Kingdom ............... 8119921

[51] Int. Cl.³ .............................................. H02J 9/02
[52] U.S. Cl. ....................................... 307/66; 307/64; 307/150
[58] Field of Search .......................... 307/64, 66, 150; 346/200

[56] References Cited

U.S. PATENT DOCUMENTS

| 3,816,768 | 6/1974 | Stein | 307/64 X |
| 3,823,388 | 7/1974 | Chadima et al. | 340/172.5 |
| 4,019,174 | 4/1977 | Vanderpool et al. | 340/172.5 |
| 4,051,945 | 10/1977 | Fujimoto et al. | 307/66 X |
| 4,086,523 | 4/1978 | Izumi | 320/2 |
| 4,122,359 | 10/1978 | Breikss | 307/64 |
| 4,143,417 | 3/1979 | Wald et al. | 364/900 |
| 4,229,686 | 8/1980 | Mullersman et al. | 320/2 |

FOREIGN PATENT DOCUMENTS 1313718 4/1973 United Kingdom .
1507036 4/1978 United Kingdom .
1520573 8/1978 United Kingdom .
1549191 7/1979 United Kingdom .
1549307 7/1979 United Kingdom .
1554013 10/1979 United Kingdom .
2067018 7/1981 United Kingdom .

OTHER PUBLICATIONS

IBM Technical Disclosure Bulletin, vol. 5, No. 11, Apr. 1973, pp. 3408-3409.
Modern Electronic, Sweden 12/80 G 11 C7/00 pp. 35 to 38.
IBM Technical Disclosure Bulletin, vol. 15, No. 9, Feb. 1973, p. 2830.

Primary Examiner—Michael L. Gellner
Assistant Examiner—Derek Jennings
Attorney, Agent, or Firm—Leydig, Voit, Osann, Mayer & Holt, Ltd.

[57] ABSTRACT

A back-up electrical power supply module provides a back-up supply for a plug-in volatile electrical device such as a memory module. The memory module has a dual-in-line pins which engage socket openings of a standard dual-in-line circuit board connector. The back-up supply module is mounted on top of the memory module and has dual-in-line pins which contact corresponding ones of the pins of the memory module and corresponding socket openings. In this way the back-up supply module and the memory module can be unplugged as a unit and when unplugged, the back-up supply will maintain the contents of the volatile memory module intact.

14 Claims, 4 Drawing Figures

BACK-UP ELECTRICAL POWER SUPPLIES

BACKGROUND OF THE INVENTION

1. Field of the Invention

The present invention relates to back-up electrical power supplies for electrical equipment.

More specifically, the invention relates to back-up supplies for electrically powered devices which require a continuous electrical supply (at least in some applications).

2. Description of the Prior Art

There are many examples of such devices. For example, electrical memories and other devices may be of volatile form, that is, they rely on a sustained supply of power to prevent the loss of any data which is stored or any function which is enabled. Thus in the event of a power failure the contents of the memory and the function of the device will be lost.

It has been proposed to provide a back-up power supply for such memories and devices. In one case in which a back-up power supply for a memory is provided, the back-up power supply is mounted on the same circuit board as that into which the memory is plugged and furthermore additional circuitry is mounted on that circuit board to sense the failure of the power supply and to switch the back-up power supply in instead.

This arrangement is relatively inconvenient and inflexible. Plug-in memory modules allow such modules to be relatively easily interchanged. However, this cannot be done without loss of the contents of the memory except by interchanging circuit boards provided with back-up power supplies.

This tends to be expensive and may not be possible where the circuit boards in question are incompatible.

It is an object of the invention to provide an improved back-up electrical power supply.

SUMMARY OF THE INVENTION

According to the invention, there is provided a back-up electrical power supply for an electrically powered device which requires a continuous electrical supply and which is connected to input and output connections and to a normal power supply via plug and socket means, the back-up power supply being connected to the electrical device and to the normal power supply via plug and socket means which enable it and the electrical device to be removed as a unit from the input and output connections and the normal power supply so that the back-up power supply takes over the function of providing said electrical supply to the said device when the device is unplugged together with the back-up electrical power supply from the normal power supply.

According to the invention, there is further provided a module comprising a housing having a plurality of connector pins for engaging corresponding openings in a printed circuit board connector socket, the housing enclosing a volatile memory and a back-up electrical power supply arranged to supply the memory with power when the power which is normally supplied through the connector pins ceases.

According to the invention, there is still further provided a back-up electrical power supply module comprising a housing enclosing a back-up power supply and formed as a plug-in unit, the unit being arranged to be plugged into a memory module having a volatile memory, to supply the memory module with power when the normal supply of power to the memory module ceases.

According to the invention, there is yet further provided a memory module incorporating a volatile memory and arranged to be plugged into a connector of a printed circuit board, and a back-up power supply module incorporating a back-up power supply and control means for supplying power from the power supply to the memory when the power from the printed circuit board is absent, the back-up power supply module being arranged to be plugged into the memory module or into the said connector in parallel with the memory module.

BRIEF DESCRIPTION OF THE DRAWINGS

Back-up power supplies for a memory module and embodying the invention will now be described, by way of example, with reference to the accompanying diagrammatic drawings in which.

DESCRIPTION OF THE PREFERRED EMBODIMENTS

Figure 1:
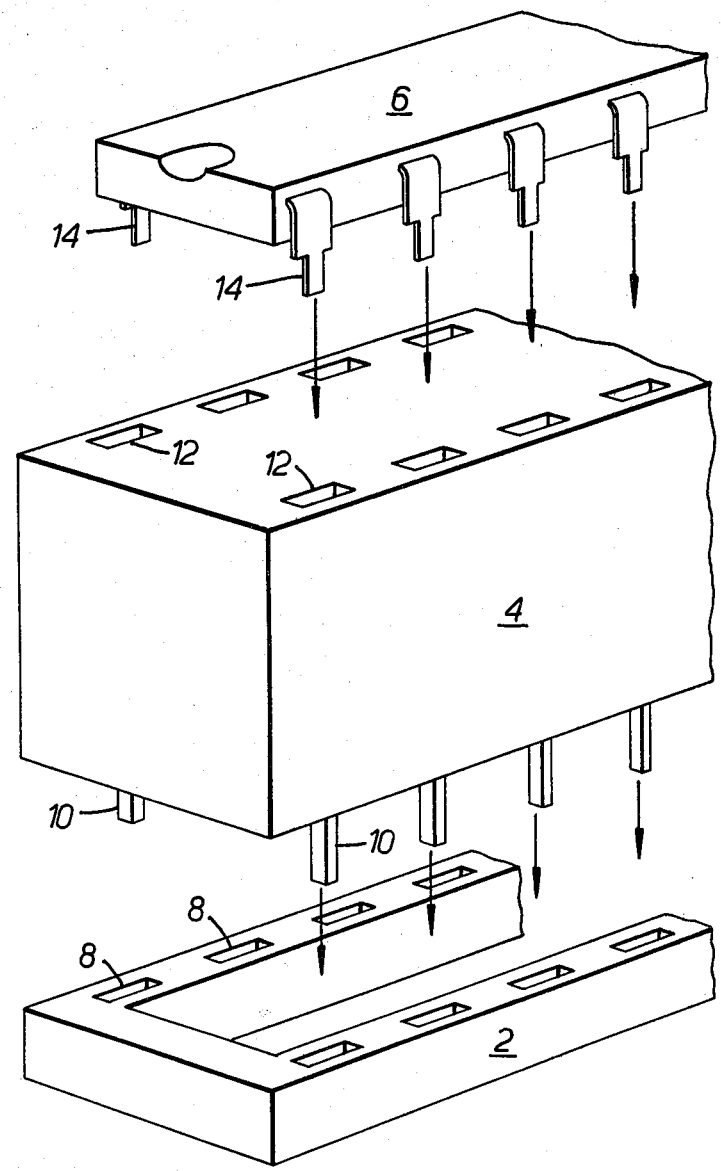
FIG. 1 is a fragmentary exploded view of a memory module, a back-up power supply module, and a circuit board socket.

The back-up power supplies to be described are arranged to supply power to a memory module in the event of a power supply failure due to a fault or due to the module being unplugged from its circuit board. However, the supplies are not limited to such an application. As shown in FIG. 1 a socket connector 2 mounted on a printed circuit board (not shown) has a plurality of socket openings 8. The socket connector 2 is in the form of a dual-in-line standard circuit board socket. A back-up power supply module 4 has a plurality of pins 10 projecting from its under surface and arranged to engage corresponding openings 8 in the connector 2. The supply module also has a plurality of socket openings 12 in its upper surface. Each opening 12 in the upper surface is electrically connected to a corresponding pin 10 in the under surface.

A memory module 6 incorporating a random access memory (RAM) has two rows of pins 14, one row projecting from each of its two opposite longitudinal sides. Each pin 14 extends outwardly and downwardly to engage a corresponding opening 12 in the upper surface of the supply module 4.

Figure 4:
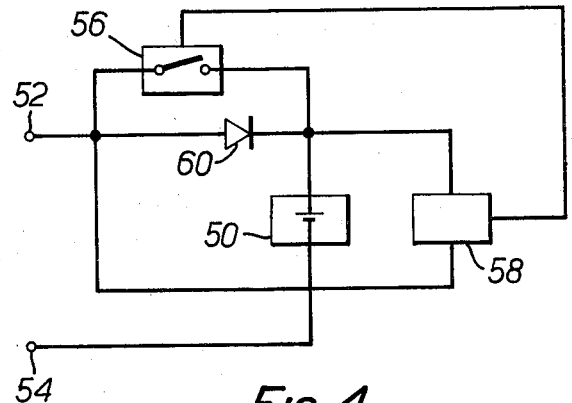
FIG. 4 is a simplified circuit diagram of the control system of the back-up power supply module.

The back-up power supply module 4 incorporates a rechargeable battery 50 (see FIG. 4) which is arranged to be charged from the mains power supply terminals 52,54 through a rectifier 60. The module 4 also incorporates a switch (56) actuatable by a control system to switch the output of the battery 50 to supply the memory module 6 instead of the main power supply and a comparator 58 operable to actuate the switch 56 when it senses that the voltage of the power supply at terminal 52 has dropped significantly below the voltage of the battery 50.

It will be appreciated that the supply module 4 can be readily plugged into the circuit board connector 2 and so be speedily incorporated into the circuit board for immediate operation.

The memory module 6 is then plugged into the supply module 4. The supply module 4 together with the memory module 6 can then be unplugged as a unit from the circuit board and in this way the contents of the memory are maintained undisturbed following its removal.

Instead the module 4 can be left permanently plugged into the supply module to provide a back-up in the event of a power failure.

It will be appreciated that by providing a plug-in back-up power supply module which can be readily separated from the memory module, the back-up power supply module can be readily replaced by other back-up supply modules incorporating updated circuitry or special modifications.

In a modification, the module 4 can incorporate a manual override switch for the switching circuitry.

Figure 2:
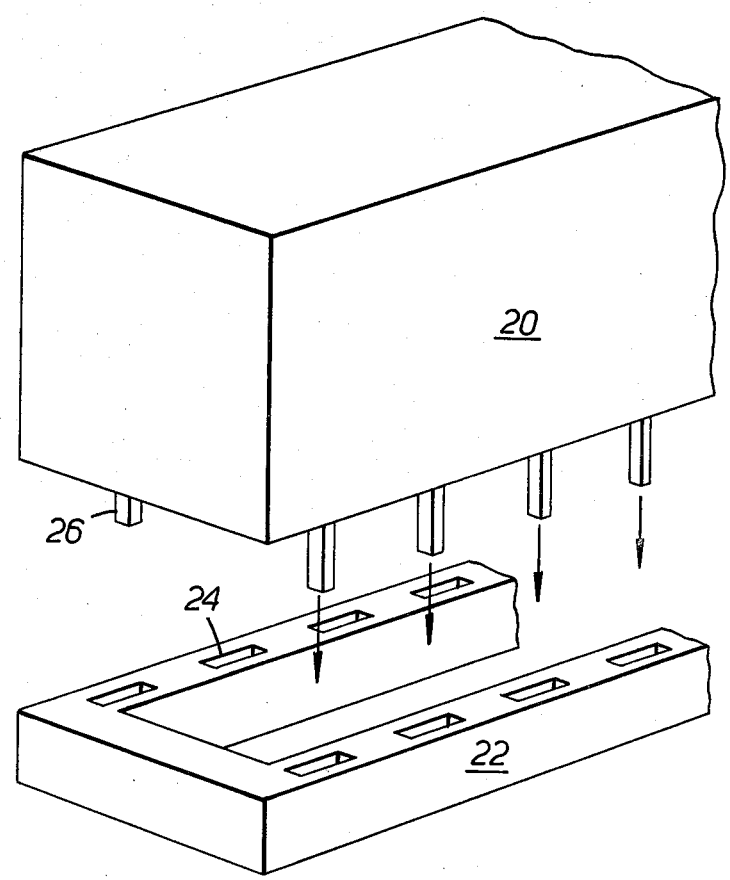
FIG. 2 is a fragmentary exploded perspective view of a combined memory and back-up power supply module and a circuit board socket.

In the arrangement shown in FIG. 2, the back-up power supply and the RAM are incorporated into a common module 20. The circuitry of the back-up power supply is similar to that described in conjunction with FIG. 4. The module 20 has pins 26 projecting from the underside which engage corresponding openings 24 in a socket connector mounted on a printed circuit board (not shown). With this arrangement the back-up power supply is permanently coupled to the RAM.

Figure 3:
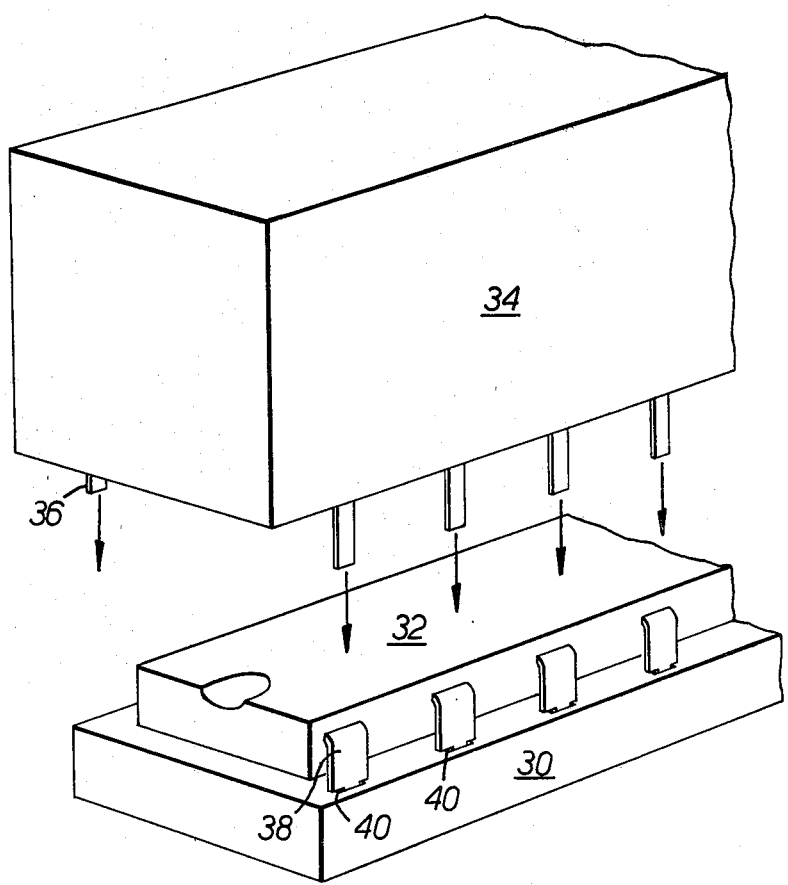
FIG. 3 is a fragmentary exploded perspective view of another form of memory module, another form of back-up power supply module and a circuit board socket.

In the arrangement shown in FIG. 3 a memory module 32 incorporating a RAM and similar to the module 6 of FIG. 1 is plugged directly into a socket connector 30 of a printed circuit board (not shown); the pins 38 of the module 32 engaging corresponding openings 40 of the connector 30.

A back-up supply module 34 has pins 36 which project from the underside and are arranged to slidingly engage corresponding pins 40 of the module 32 as well as corresponding openings 40 in the socket connector 30.

If it is required to remove the memory module 32 without losing stored data then both the memory module 32 and the back-up power supply storage module should be removed as a unit.

Advantageously the battery of the back-up power supply is a lithium or nickel-cadmium battery. It will be appreciated that instead of a rechargeable battery a nonrechargeable battery or a large capacitor can be used. This may be advantageous where space is at a premium since non-rechargeable batteries can be made smaller than rechargeable ones.

The back-up power supply module advantageously incorporates logic circuitry for inhibiting the write-enable lines during unplugging of the memory module to prevent corruption of the memory contents. Also a manual override option formed by a mechanical microswitch connected into the write-enable signal line from the socket connector could be used to prevent alteration of the memory contents during normal use. This would change the nature of the RAM to a ROM.

In a modification the back-up supply module can be used while power is supplied from the normal power supply to provide other functions. For example, the back-up supply module can be used to maintain certain signal levels for the supporting circuitry on the printed circuit board and for providing signals to block certain enable lines.

Advantageously the internal connections of the back-up power supply module are variable so that the module can be adapted to support a wide range of different memory devices.

The back-up power supply module is preferably provided with antistatic protection.

The back-up power supply module can incorporate logic switching circuitry in the form of a combination of logic gates which when activated in response to the sensing of a cessation of power from the normal power supply, will hold all essential signals to the memory module. In this way the contents of the memory module would be preserved and the memory would then be isolated from spurious signals.

It will be appreciated that while the back-up supply module has been described as providing a back-up supply for a memory module, it can equally be used to provide a back-up supply for other electrical devices such as a signal oscillator module and a microprocessor unit.

Many modifications can be made to the invention without departing from the spirit and scope of the invention as defined by the appended claims.

We claim:

1. A back-up electrical power supply in combination with an electrically powered device which requires a continuous electrical supply and which is connected to input and output connections and to a normal power supply via plug and socket means, plug and socket means connecting the back-up power supply to the electrical device and to the normal power supply to enable the back-up power supply and the electrical device to be removed as a unit from the input and output connections and the normal power supply, and circuit means for causing the back-up power supply to take over the function of providing said electrical supply to the said device when the device is unplugged together with the back-up electrical power supply, from the normal power supply.

2. A combination according to claim 1, wherein the plug and socket means comprises plug pins in said back-up electrical power supply engaging in socket openings providing the input and output connections and the normal power supply, and wherein the electrical device has plug pins, each plug pin of the supply and a corresponding plug pin of the electrical device being arranged to engage one another as well as the same respective one of the socket openings.

3. A combination according to claim 1, wherein the plug and socket means comprises a first plug and socket connection for electrically connecting the back-up supply to the electrical device, and a second plug and socket connection for electrically connecting the electrical device to a printed circuit board providing said normal power supply and the input and output connections, the two plug and socket connectors being electrically in parallel.

4. A combination according to claim 1, wherein the electrical device comprises a volatile electrical memory.

5. A combination according to claim 4, wherein the volatile electrical memory comprises a random access memory.

6. A combination according to claim 1, wherein the device comprises a signal oscillator module.

7. A combination according to claim 1, wherein the device comprises a micro processor unit.

8. A combination according to claim 1, wherein the plug and socket means is in the form of a dual-in-line plug and socket.

9. A module for mounting on a printed circuit board connector socket, the module comprising
   a housing,
   a plurality of connector pins supported by the housing for engaging corresponding openings in the connector socket,
   a volatile memory located in the housing,
   a back-up electrical power supply located in the housing, and
   circuit means arranged to supply the memory with power from the back-up electrical power supply when the power which is normally supplied through the connector pins ceases.

10. A back-up electrical power supply module comprising
   a housing,
   a back-up power supply enclosed with the housing, the housing and supply being formed as a plug-in unit, the unit being arranged to be plugged into a memory module having a volatile memory, and
   circuit means arranged to supply the memory module with power from the back-up power supply when the normal supply of power to the memory module ceases.

11. A module according to claim 10, in combination with the memory module,
   wherein the memory module has pins engaging corresponding socket openings in the back-up power supply module, and
   wherein the back-up supply module has pins electrically connected to corresponding ones of the socket openings and is arranged to plug into a socket connector of a printed circuit board.

12. A module according to claim 10, in combination with the memory module, wherein the back-up power supply and the memory module each having a plurality of pins arranged to engage corresponding common socket openings of a socket connector of a printed circuit board.

13. A memory module incorporating a volatile memory and arranged to be plugged into a connector of a printed circuit board,
   a back-up supply module incorporating a back-up power supply, and
   control means for supplying power from the back-up power supply to the memory when the power from the printed circuit board is absent,
   the memory module being arranged to be plugged into the back-up supply module or into the said connector in parallel with the back-up supply module.

14. A module according to claim 13, including
   a comparator for comparing the voltage of the normal power supply with that of the back-up power supply, and
   switching means responsive to the comparator detecting a predetermined difference to connect the back-up power supply to the memory.

* * * * *

REEXAMINATION CERTIFICATE (2530th)
United States Patent [19]
Anstey et al.

[11] B1 4,381,458
[45] Certificate Issued Apr. 11, 1995

[54] BACK-UP ELECTRICAL POWER SUPPLIES

[75] Inventors: Michael J. Anstey, Wokingham; David F. Brown, Thorplands, both of England

[73] Assignee: Dallas Semiconductor, Dallas, Tex.

Reexamination Request:
No. 90/002,461, Sep. 30, 1991

Reexamination Certificate for:
Patent No.: 4,381,458
Issued: Apr. 26, 1983
Appl. No.: 290,104
Filed: Aug. 4, 1981

[30] Foreign Application Priority Data

Aug. 6, 1980 [GB] United Kingdom ............... 8025573
Sep. 24, 1980 [GB] United Kingdom ............... 8030819
Feb. 9, 1981 [GB] United Kingdom ............... 8103834
Jun. 29, 1981 [GB] United Kingdom ............... 8119921

[51] Int. Cl.⁶ ............................................. H02J 9/02
[52] U.S. Cl. ................................... 307/66; 307/64; 307/150
[58] Field of Search ....................... 307/64, 66, 150; 361/413; 439/65

[56] References Cited

U.S. PATENT DOCUMENTS

4,503,494  3/1985  Hamilton et al. .................. 364/200
4,998,888  3/1991  Link et al. .............................. 439/73
5,055,704  10/1991  Link et al. ............................ 307/66

OTHER PUBLICATIONS

Anderson, Jr., et al., "Volatile Memory Data Retention", IBM TDB vol. 14 No. 9 pp. 2712–2713 (Feb. 1972).

*Primary Examiner*—Jeffrey A. Gaffin

[57] ABSTRACT

A back-up electrical power supply module provides a back-up supply for a plug-in volatile electrical device such as a memory module. The memory module has a dual-in-line pins which engage socket openings of a standard dual-in-line circuit board connector. The back-up supply module is mounted on top of the memory module and has dual-in-line pins which contact corresponding ones of the pins of the memory module and corresponding socket openings. In this way the back-up supply module and the memory module can be unplugged as a unit and when unplugged, the back-up supply will maintain the contents of the volatile memory module intact.

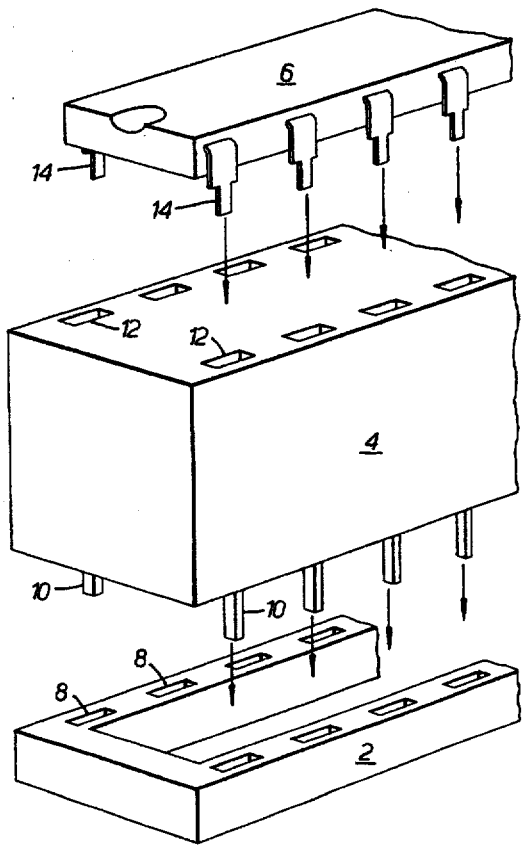

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 3–7, 9, 10, 13 and 14 are cancelled.

Claims 2, 8, 11 and 12 are determined to be patentable as amended.

2. [A combination according to claim 1,] *A back-up electrical power supply in combination with an electrically powered device which requires a continuous electrical supply and which is connected to input and output connections and to a normal power supply via plug and socket means*
   plug and socket means connecting the back-up power supply to the electrical device and to the normal power supply to enable the back-up power supply and the electrical device to be removed as a unit from the input and output connections and the normal power supply, and
   circuit means for causing the back-up power supply to take over the function of providing said electrical supply to the said device when the device is unplugged together with the back-up electrical power supply, from the normal power supply,
   wherein the plug and socket means comprises plug pins in said back-up electrical power supply engaging in socket openings providing the input and output connections and the normal power supply, and
   wherein the electrical device has plug pins, each plug pin of the supply and a corresponding plug pin of the electrical device being arranged to engage one another as well as the same respective one of the socket openings.

8. [A combination according to claim 1,] *A back-up electrical power supply in combination with an electrically powered device which requires a continuous electrical supply and which is connected to input and output connections and to a normal power supply via connector pins and a connector socket on a printed circuit board,*
   connector pins and a connector socket connecting the back-up power supply to the electrical device and to the normal power supply to enable the back-up power supply and the electrical device to be removed as a unit from the input and output connections and the normal power supply, and
   circuit means for causing the back-up power supply to take over the function of providing said electrical supply to the said device when the device is disconnected together with the back-up electrical power supply, from the normal power supply,
   wherein the [plug and socket means is] *connector pins and a connector socket on a printed circuit board are* in the form of a dual-in-line plug and socket.

11. [A module according to claim 10, in combination with the memory module,] *A back-up electrical power supply module comprising*
   *a housing*
   *a back-up power supply enclosed with the housing, the housing and supply being formed as a plug-in unit, the unit being arranged to be plugged into a memory module having a volatile memory, and*
   *circuit means arranged to supply the memory module with power from the back-up power supply when the normal supply of power to the memory module ceases,*
   wherein the memory module has pins engaging corresponding socket openings in the back-up power supply module, and
   wherein the back-up supply module has pins electrically connected to corresponding ones of the socket openings and is arranged to plug into a socket connector of a printed circuit board.

12. [A module according to claim 10, in combination with the memory module,] *A back-up electrical power supply module comprising*
   *a housing*
   *a back-up power supply enclosed with the housing, the housing and supply being formed as a plug-in unit, the unit being arranged to be plugged into a memory module having a volatile memory, and*
   *circuit means arranged to supply the memory module with power from the back-up power supply when the normal supply of power to the memory module ceases,*
   wherein the back-up power supply and the memory module each having a plurality of pins arranged to engage corresponding common socket openings of a socket connector of a printed circuit board.

* * * * *